US008125262B2

(12) United States Patent
Kusuda

(10) Patent No.: US 8,125,262 B2
(45) Date of Patent: Feb. 28, 2012

(54) LOW POWER AND LOW NOISE SWITCHED CAPACITOR INTEGRATOR WITH FLEXIBLE INPUT COMMON MODE RANGE

(75) Inventor: Yoshinori Kusuda, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 58 days.

(21) Appl. No.: 12/726,455

(22) Filed: Mar. 18, 2010

(65) Prior Publication Data

US 2011/0043270 A1 Feb. 24, 2011

Related U.S. Application Data

(60) Provisional application No. 61/235,226, filed on Aug. 19, 2009.

(51) Int. Cl.
*H03K 5/00* (2006.01)

(52) U.S. Cl. ......................... 327/337; 327/552; 327/558

(58) Field of Classification Search .......... 327/336–337, 327/501–559
See application file for complete search history.

(56) References Cited

U.S. PATENT DOCUMENTS 6,002,299 A 12/1999 Thomsen
6,703,894 B1 * 3/2004 Stockstad et al. ............. 327/552
7,044,571 B2 * 5/2006 Smith et al. ..................... 347/10
7,292,095 B2 11/2007 Burt et al.
7,345,530 B1 3/2008 Li et al.
7,973,596 B2 * 7/2011 Eschauzier et al. ............... 330/9
2008/0061858 A1 3/2008 Cao et al.

OTHER PUBLICATIONS

International Search Report dated Oct. 25, 2010, in counterpart International application No. PCT/US2010/044864.

* cited by examiner

*Primary Examiner* — Dinh T. Le
(74) *Attorney, Agent, or Firm* — Kenyon & Kenyon LLP

(57) ABSTRACT

An integrator is described that may include a level-shifting capacitor, a feedback capacitor, a pre-amplifier stage and a multi-path amplifier module. The integrator may have inputs for connected an input signal source to the level-shifting capacitor. The level-shifting capacitor is connected to an input of a pre-amplifier stage of an integration signal path and to the input. The level-shifting capacitor may level shift the voltage at the input of the circuit to a lower voltage at the input of the pre-amplifier stage. Thereby, the supply voltage to the pre-amplifier stage may be reduced as well as have limited power consumption, limited temperature rise, and reduced noise that may be attributed to any thermal effects.

9 Claims, 6 Drawing Sheets

LOW POWER AND LOW NOISE SWITCHED CAPACITOR INTEGRATOR WITH FLEXIBLE INPUT COMMON MODE RANGE

CROSS REFERENCE TO RELATED APPLICATION

This application claims priority under 35 U.S.C. §119 to U.S. Provisional Patent Application No. 61/235,226, filed Aug. 19, 2009 and entitled "Low Power and Low Noise Switched Capacitor Integrator with Flexible Input Common Mode Range," which is herein incorporated by reference in its entirety.

BACKGROUND

Demand for low power electronic devices continues to grow. Circuit designers are increasingly lowering the power provided to electronic devices. However, lower power may have an adverse effect on the dynamic range of components of an electronic device. For example, if an amplifier or comparator device is powered by a lower supply voltage (e.g., 1.8 volts), or lower current supply it limits the range of input signals that can be applied to the device. In order to compensate for the lower power supply in an integrator circuit, for example, a feedback capacitor may need to be larger to accept higher input currents with such a low supply voltage. However, the larger feedback capacitor makes the integrator gain lower and, when the input current signal is lower, the output signal may not be large enough to be detected by a following stage.

Output noise may also be generated, for example, due to the thermal characteristics of the electrical components (e.g., transistors) of the amplifiers used in the electronic devices, such as integrators. The noise may be propagated upstream thereby causing unacceptable output noises.

Circuits that perform integration functions are known in the art as integrators. In a conventional integrator as shown in FIG. 1, the input current $I_{IN}$ is integrated across the capacitor $C_{FB}$. In other words, as $I_{IN}$ changes over time, the voltage $V_{OUT}$ changes inversely to the input current signal.

In more detail, when reset switch $SW_{RESET}$ is CLOSED, the feedback capacitor $C_{FB}$ is discharged, the voltage $V_{IN}$ at the integrator input and output voltage $V_{OUT}$ are reset to equal $V_{REF}$ by the response of the amplifier A1 (after reset $V_{IN}=V_{REF}=V_{OUT}$).

When integrating, the reset switch $SW_{RESET}$ is OPEN, and the input signal $I_{IN}$ is applied to the integrator input briefly causing voltage $V_{IN}$ to fluctuate from voltage $V_{REF}$. The amplifier A1 responds to this fluctuation by outputting a signal to $V_{OUT}$, so $V_{IN}$ will return to the value $V_{REF}$. At any time T during integration, the output voltage $V_{OUT}$ may be approximately equal to $V_{REF}-(I_{IN}*T/C_{FB})$, where T is the time while integrating the current signal $I_{IN}$.

Generally, the amplifier A1 outputs an amplified voltage $V_{OUT}$ proportional to the difference between $V_{REF}$ and $V_{IN}$. However, the amplified voltage output by the amplifier $A_1$ is limited by power supply voltage $V_{DD}$ to the amplifier $A_1$. Amplifier $A_1$ cannot output a voltage higher than $V_{DD}$ or lower than ground as shown in FIG. 1. In other words, $V_{OUT}$ will not be greater than $V_{DD}$.

As mentioned above, circuit designers aim to design circuits having low power and low noise, e.g., thermal noise. The circuit designs require a tradeoff between low power and higher noise, because larger supply current is needed for reducing thermal noise associated with transistors within the amplifiers. Additionally, an external sensor, which may be the input current source $I_{IN}$, may require higher voltage potentials for proper bias conditions. In the conventional integrator, such as those used in imaging applications, the input current is integrated over time and a representative output voltage is provided. Noise introduced by the amplifiers into the output voltage will be propagated to further devices. Therefore, it is desirable to reduce the amount of noise introduced by the amplifiers of the integrator.

Noise from amplifiers may result from higher temperatures. The higher temperature (for example, approximately 85 degrees C.) can increase thermal noise. One method of reducing thermal noise is to raise the supply current provided by the voltage source of $V_{DD}$. The lower power consumption of the amplifier by using a lower supply voltage also results in lower noise due to a reduced temperature of the amplifier.

One known attempt to address this problem has been to put amplifiers in series as shown in FIG. 2. The integrator of FIG. 2 includes a low noise amplifier (LNA) A1, a second amplifier A2, and a feedback capacitor $C_{FB}$. The LNA A1 that is coupled to a reference voltage $V_{REF}$ on a first input and a current source $I_{IN}$ on a second input. The voltage at the second input is labeled $V_{IN}$. The LNA A1 is powered by a voltage source $V_{DDL}$. The second amplifier A2 (not necessarily a low noise amplifier) has inputs coupled to the outputs of LNA A1, and is powered by a second voltage source $V_{DDH}$. The feedback capacitor $C_{FB}$ is connected to an output of the second amplifier A2 and the $V_{IN}$ node.

While amplifier A2 may be a transconductance amplifier. However, the noise contribution of amplifier A2 is divided by the gain of amplifier A1. Therefore, the noise generated by amplifier A2 is not as problematic. Noise generated by amplifier A1 may be propagated through to $V_{OUT}$. The gain of amplifier A1 may be between 5 and 20. The power supply voltage $V_{DDL}$ may be less than 5 volts.

In contrast to amplifier A1, amplifier A2 may be allowed to be a higher noise source by having a lower supply current and a higher supply voltage $V_{DDH}$, which may be equal to or greater than 5 volts. The configuration shown in FIG. 2 realizes lower power, and lower noise with a wider dynamic range than the conventional integrator of FIG. 1. However, the input common mode range, represented by $V_{IN}$, is limited to a lower input potential because the amplifier A1 is supplied with a lower supply voltage $V_{DDL}$.

Since the supply voltage $V_{DDL}$ of amplifier A1 is low, the reference voltage $V_{REF}$ must be either equal to or less than $V_{DDL}$. In the integrator shown in FIG. 2, the input common mode range $V_{IN}$ is dependent upon the value of $V_{REF}$, which is limited by Supply voltage $V_{DDL}$. Due to this limitation, the above configuration may not be suitable for use when the input voltage $V_{IN}$ and the reference voltage $V_{REF}$ need to be higher. For example, when input current source $I_{IN}$ is an external sensor that requires higher potential for its proper bias condition, the integrator confirmation of FIG. 2 that supplies the input current signal may not be appropriate.

The input device $I_{IN}$ may be a customer device, such as a photodiode. A photodiode typically supplies between 0-5 volts. If 5 volts is applied to amplifier $A_1$, $V_{DDL}$ would have to supply at least that amount of voltage, which would result in higher power consumption of the circuit. In addition, the noise associated with amplifier A1 may be dominated by thermal noise. The thermal noise of amplifier A1 may be reduced if more supply current is consumed. Therefore, in order for amplifier A1 to achieve both low power consumption and low noise, less voltage and more supply current, respectively, is needed to be supplied from $V_{DDL}$.

Accordingly, another more flexible solution is needed. There is a need for a low power, low noise integrating device that provides acceptable bias conditions.

DETAILED DESCRIPTION

Embodiments of the present invention provide an integrator configuration that may include a level-shifting capacitor, a feedback capacitor, a switch module, a pre-amplifier stage and a multi-path amplifier module. The integrator may have inputs for connecting an input signal source to the level-shifting capacitor. The level-shifting capacitor may be connected to an input of a pre-amplifier stage of an integration signal path and to an input of the integrator circuit. The level-shifting capacitor may level shift the voltage at the input of the integrator circuit to a lower voltage at the input of the pre-amplifier stage. Thereby, the supply voltage to the pre-amplifier stage may be reduced as well as limiting power consumption, limiting temperature rise, and reducing noise attributed to any thermal effects on the amplifier.

Figure 1:
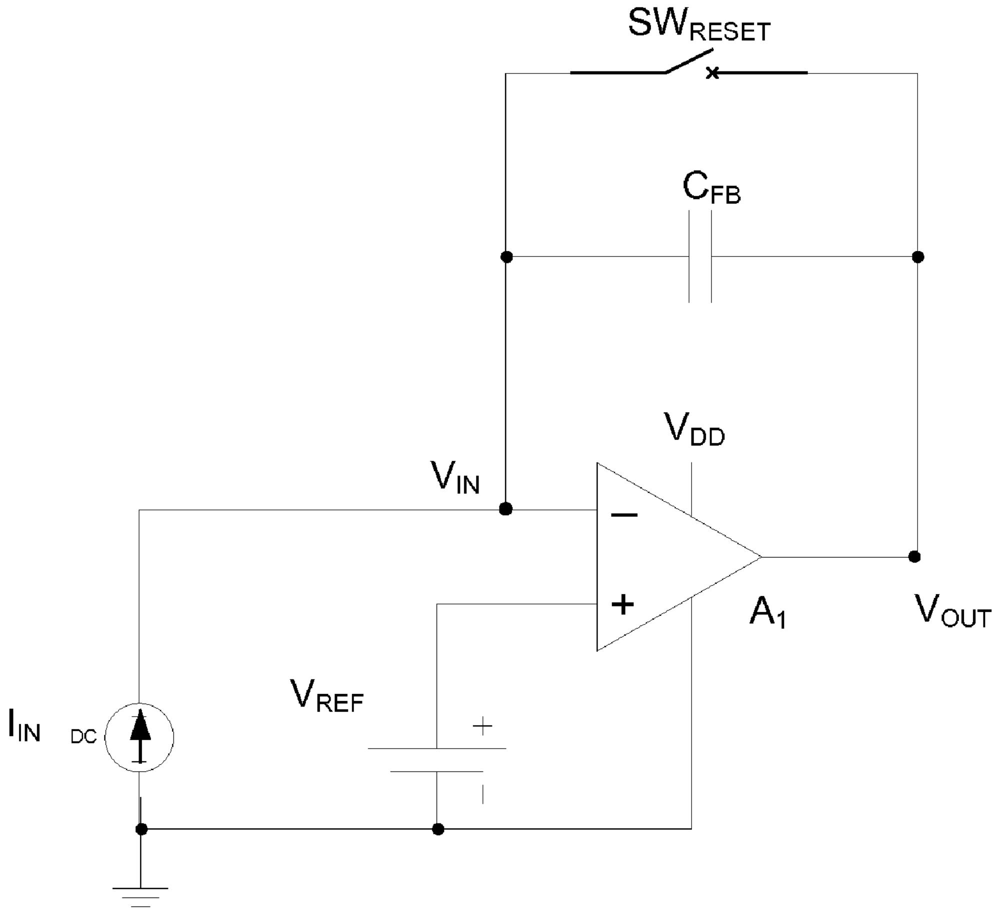
FIG. 1 PRIOR ART
FIG. 1 illustrates a conventional integrator circuit.
Figure 2:
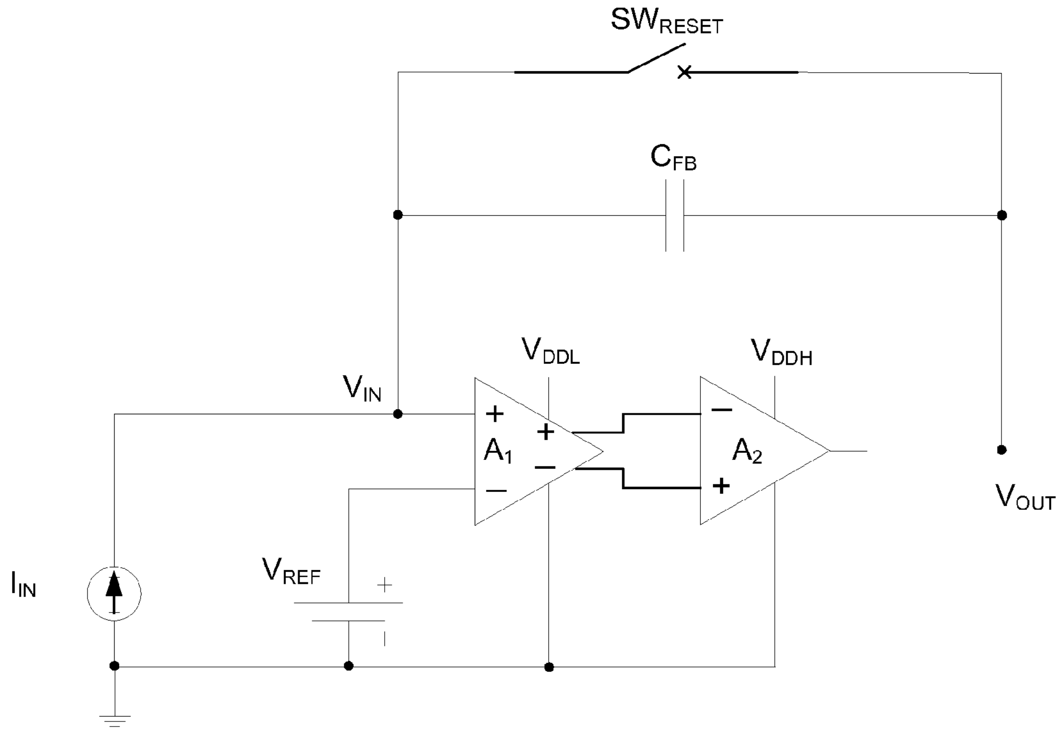
FIG. 2 PRIOR ART
FIG. 2 illustrates a conventional multi-stage integrator circuit.
Figure 3:
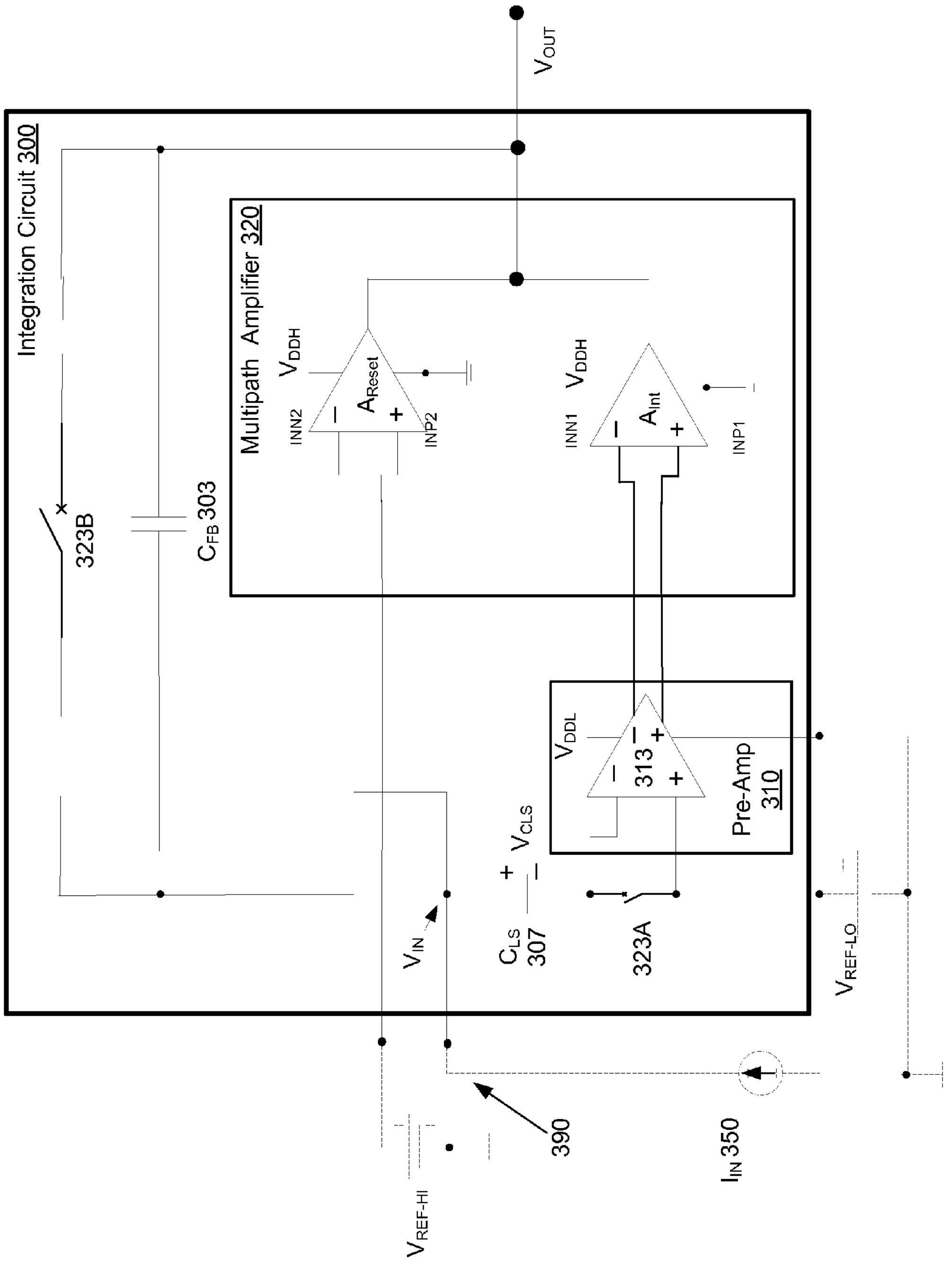
FIG. 3 illustrates an exemplary circuit diagram according to an embodiment of the invention.

FIG. 3 illustrates an exemplary circuit diagram according to an embodiment of the invention. The integrator 300 may include a pre-amplifier stage 310, a level-shifting capacitor $C_{LS}$ 307, a feedback capacitor $C_{FB}$ 303, a multi-path amplifier module 320, and a reset switches 323A and 323B. Reset switches 323A and 323B may be implemented using transistors.

The pre-amplifier stage 310 may include an amplifier 313. The amplifier 313 may be a low noise amplifier, which may be characterized by a high supply current. In addition, the amplifier 313 can have a low thermal noise voltage density of about 2 nV/sqrt(Hz). The amplifier 313 may have a first input, a second input, a power supply input terminal, and a pair of outputs (a first output and a second output). The first input may be connected to a terminal of level shift capacitor $C_{LS}$ 307 and a first terminal of reset switch 323A. The second input may be connected to a pre-amplifier stage reference voltage source $V_{REF-LO}$ and to a second terminal of reset switch 323A. The power supply input terminal may be connected to voltage source $V_{DDL}$, which may be in the pre-amplifier stage 310 or may be an external voltage source. The pair of outputs may be connected to inputs of the amplifier module 320. The pair of outputs may be differential outputs.

Multi-path amplifier module 320 may include a first amplifier $A_{INT}$ and second amplifier $A_{RESET}$. Amplifier $A_{INT}$ may have inputs connected to A1 the outputs of pre-amplifier stage 413, a power supply input connected to voltage source $V_{DDH}$, and an output connected to $V_{OUT}$, the second terminal of feedback capacitor CFB 303 and second terminal of reset switch 323B.

The supply voltage $V_{DDL}$ to the pre-amplifier stage 310 may be lower than the supply voltage $V_{DDH}$ to the multi-path amplifier module 320. A higher input voltage up to the value of supply voltage $V_{DDH}$ may be applied to the integrator 300, while still utilizing the lower supply voltage $V_{DDL}$ for the pre-amplifier 310. Being able to use the lower supply voltage $V_{DDL}$ may be facilitated by the inclusion of the level-shifting capacitor $C_{LS}$ 307 that reduces the input voltage to the pre-amplifier 310. For example, the supply voltage $V_{DDH}$ may be 5 volts, while the supply voltage $V_{DDL}$ may be 1.8 volts. The supply voltage $V_{DDL}$ may be lower than the input voltage $V_{IN}$. The input voltage $V_{IN}$ may be 4-5 volts. Generally, this allows supply voltage $V_{DDL}$ to be set independent of $V_{IN}$.

The level shifting capacitor $C_{LS}$ 307 may be connected to a first terminal of feedback capacitor $C_{FB}$ 303, to reset switch 323B and an input in the reset circuit path to amplifier $A_{RESET}$ of the amplifier module 320. The capacitor $C_{LS}$ 307 may also be connected to a signal input of the pre-amplifier stage 310 and reset switch 323A.

The feedback capacitor $C_{FB}$ 303 may be connected to a first terminal of reset switch 323B, the first terminal of level-shifting capacitor $C_{LS}$ 307, and an input in the reset circuit path to amplifier $A_{RESET}$ of the amplifier module 320. Capacitor CFB 303 may also be connected to both the output $V_{OUT}$ of amplifier module 320 and to a second terminal of the reset switch 323B. As shown in FIG. 3, the reset switch 323B is connected in parallel to the feedback capacitor $C_{FB}$ 303.

Referring back to the multi-path amplifier module 320, the inputs INP1/INN1 of amplifier $A_{INT}$ may receive respective differential signals output from amplifier 313 of the pre-amplifier stage 310.

Amplifier $A_{INT}$ may be a transconductance amplifier, and may have different circuit parameter than amplifier $A_{RESET}$ because $A_{INT}$ may have, for example, different electrical requirements.

Amplifier $A_{RESET}$ may have its inputs connected to $V_{REF-HI}$ and $V_{IN}$, respectively; a power supply input connected to voltage source $V_{DDH}$; and an output connected to $V_{OUT}$. The inputs INP2/INN2 of amplifier $A_{RESET}$ may receive respective signals $V_{REF-HI}$ and $V_{IN}$. Amplifier $A_{RESET}$ may also be a transconductance amplifier.

The outputs of the amplifier $A_{INT}$ and the amplifier $A_{RESET}$ may be connected together at $V_{OUT}$. The combined gain of the pre-amplifier 310 and amplifier $A_{INT}$ may be greater than the gain of amplifier $A_{RESET}$.

Amplifier power supply voltages $V_{DDL}$ and $V_{DDH}$ may be provided from external sources to facilitate the programmability of the integrator 300. Optionally, voltage sources $V_{DDL}$ and $V_{DDH}$ may either be included in integrator 300 or externally, and have pre-determined settings or programmable settings. In either case, $V_{DDL}$ may be set independent of the input signal source $I_{IN}$ 350 and its related $V_{IN}$.

The foregoing embodiments permit the amplifier power supply voltages $V_{DDL}$ and $V_{DDH}$ to be set at different levels. The power supply voltage $V_{DDL}$ may be set lower than $V_{DDH}$. The configuration of the forgoing embodiments may provide a designer with the capability to set the integrator's input bias voltage independent of the power supply voltage $V_{DDL}$ for the pre-amplifier stage thereby effectively balancing the need for a sufficiently high output voltage with the need for reduced power consumption and reduced noise characteristics.

In an embodiment, the reference voltage $V_{REF-LO}$ may have a value of approximately 1.0 volt and reference voltage $V_{REF-HI}$ can have a value as high as approximately 5 volts. The multipath amplifier 320 may have inputs INN1 and INP1 connected to outputs of the pre-amplifier 310, and inputs INN2 and INP2 connected, respectively, to the input 390 of the integrator 300 and a reference voltage $V_{REF-HI}$.

The integrator 300 may operate in either a reset mode or an integration mode. When in reset mode, the switches 323A and 323B may be CLOSED, and the circuit 300 resets the input voltage $V_{IN}$ to reference voltage $V_{REF-HI}$, and the voltage at the input of the pre-amplifier stage 310 may be reset to reference voltage $V_{REF-LO}$. The capacitor $C_{FB}$ 303 may be discharged because of the short circuit created by the closed switch 323B. The inputs to the pre-amplifier stage 310 are shorted, so amplifier 313 does not have an appreciable output, and the voltage at the inverting input of amplifier 313 may be reset to $V_{REF-LO}$. Also at reset, the capacitor $C_{LS}$ 307 is charged to a value of $V_{CLS}$, which may be equal to $V_{REF-HI}$ minus $V_{REF-LO}$. After completion of the above operations, the integrator 300 is now reset to integrate the next input signal.

In integration mode, the switches 323A and 323B are OPEN, and the integrator 300 functions as an integrator. A signal from an input current source $I_{IN}$ 350 may be applied to the integrator 300 at input 390. The input current signal may be integrated over capacitor $C_{FB}$ 303 as previously explained.

The voltage $V_{IN}$ may fluctuate from $V_{REF-HI}$, in which case the pre-amplifier 310 and the multipath amplifier 320 respond to return, via the feedback path through feedback capacitor $C_{FB}$ 303, the voltage $V_{IN}$ to $V_{REF-HI}$. The level shift capacitor $C_{LS}$ 307, which may act as a floating voltage source, and has been charged to a voltage $V_{CLS}$ at reset, may reduce the voltage $V_{IN}$ to a voltage approximately equal to $V_{IN}$-$V_{CLS}$ that may be maintained at the inverting input of amplifier 313.

The voltages $V_{IN}$-$V_{CLS}$ and $V_{REF-LO}$ may be less than the power supply voltage of $V_{DDL}$ of amplifier 313. The amplifier 313 may output differential voltages to the inputs INN1/INP1 of the multipath amplifier 320 representative of the difference between the values of $V_{IN}$-$V_{CLS}$ and $V_{REF-LO}$. The differential voltages received on inputs INN1/INP1 may be input into a transconductance amplifier $A_{INT}$, which may output a gained current that may be proportional to the difference of the differential voltages received on inputs INN1/INP1.

Multipath amplifier 320 may also have inputs INN2/INP2 that may receive the voltages $V_{IN}$ and $V_{REF-HI}$, respectively. The voltages on inputs INN2/INP2 may be input into the transconductance amplifier $A_{RESET}$, which may output a gained current proportional to the difference of the voltages $V_{IN}$ and $V_{REF-HI}$. The current outputs of the amplifiers $A_{INT}$ and $A_{RESET}$ may be connected together, so the outputs of each are combined, and output to $V_{OUT}$. Via the feedback path through feedback capacitor $C_{FB}$ 303, the voltage $V_{IN}$ is returned to $V_{REF-HI}$. After the input current signal from current source $I_{IN}$ 350 is integrated for a predetermined time period, the integrator 300 enters a reset mode, and is reset to a reference voltage as previously explained above.

Generally, $V_{IN}$ may be approximately 4-5 volts, while the power supply voltage $V_{DDL}$ to amplifier 313 may be approximately 1.8 volts. Consequently, the input voltage at the inverting input of amplifier 313 may be expected to be lower than or approximately equal to the voltage $V_{DDL}$ due to the level-shifting of capacitor $C_{LS}$ 307. The input to the inverting input of amplifier 313 may be maintained at a voltage of approximately $V_{IN}$-$V_{CLS}$, which may be approximately equal to $V_{REF-LO}$. The voltage $V_{CLS}$ may be expected to have minimal change from its voltage at reset. Thereby, the level-shift capacitor may reduces the voltage level of an input by the voltage $V_{CLS}$ to a voltage level that is less than or equal to the supply voltage $V_{DDL}$. Overall, the noise and the power consumption of the circuit 300 may be reduced in comparison to prior art systems because the lower supply voltage VDDL with a higher supply current may be used.

Figure 4:
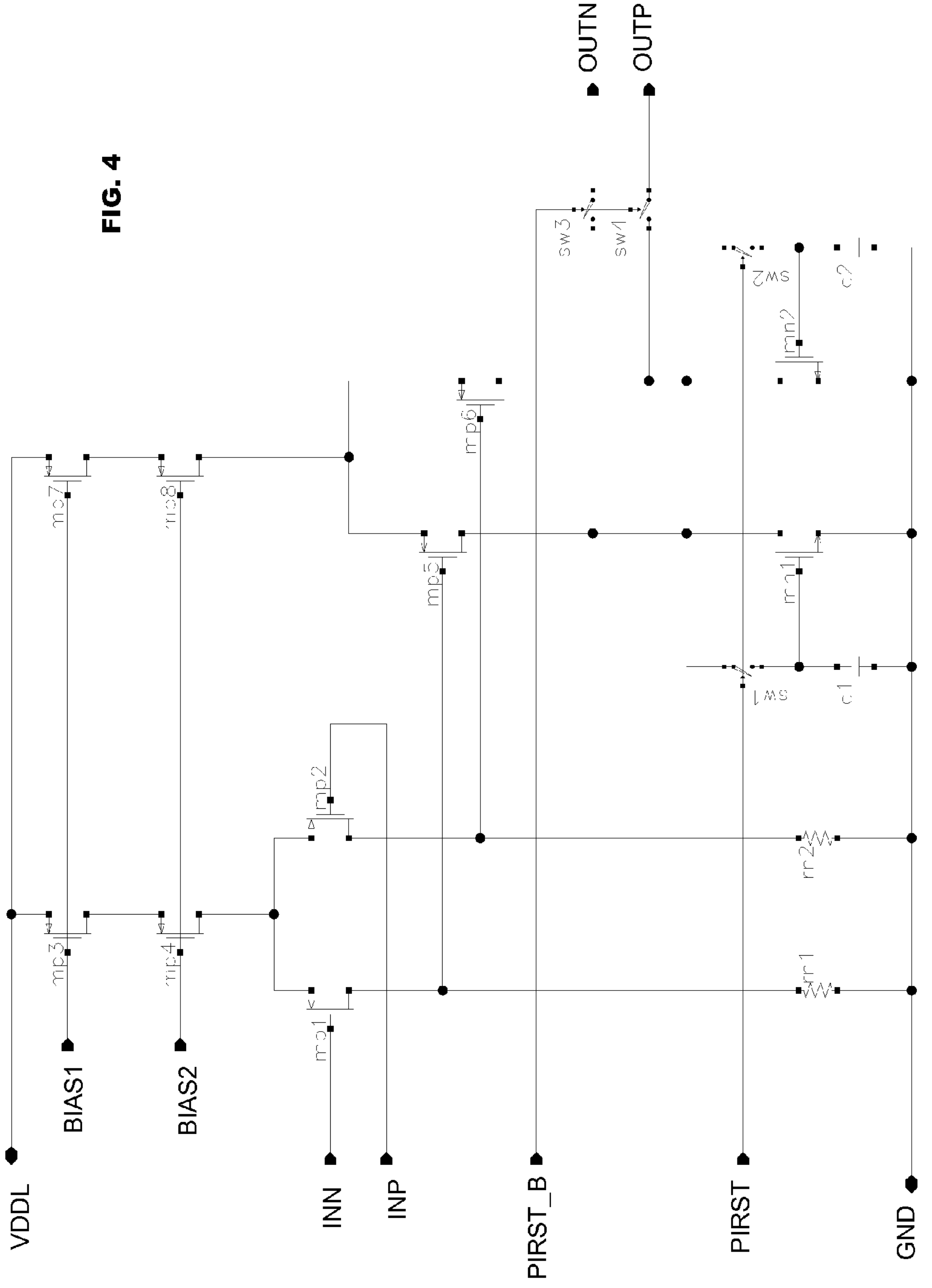
FIG. 4 illustrates an exemplary implementation of a pre-amplifier stage of an embodiment of the present invention.
Figure 5:
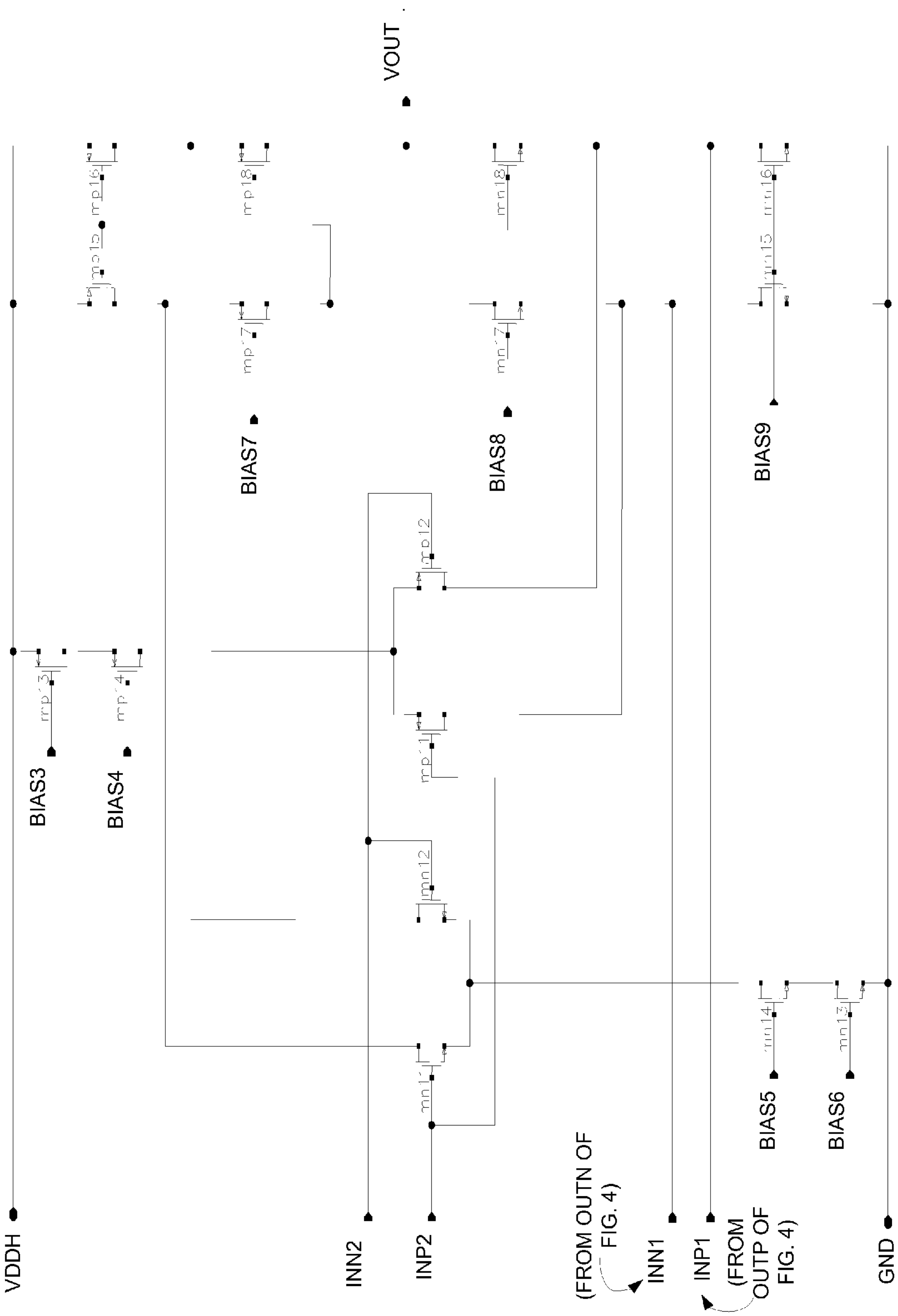
FIG. 5 illustrates an exemplary implementation of a multipath amplifier stage of an embodiment of the present invention.

An exemplary circuit diagram of the pre-amplifier and the multipath amplifier are shown respectively in FIGS. 4 and 5. FIG. 4 illustrates one of a plurality of exemplary configurations for a pre-amplifier stage according to an embodiment of the present invention.

The exemplary pre-amplifier stage may have multiple stages. For example, a first stage may have a P-channel input pair with Mp1 and Mp2, and may have load resistors of Rn1 and Rn2, to form a wide band amplifier with fixed gain. The gain may be given by gmp1*Rn1 where gmp1 represents a transconductance of the Mp1 and the Mp2. For example, a second stage may have another P-channel input pair with Mp5 and Mp6 and may have current sources of Mn1 and Mn2, to form a transconductance amplifier. The transconductance of this stage may be gmp5, which is the transconductance of the Mp5 and the Mp6.

The exemplary first and second stage may operate in a reset mode and an integration mode. During the reset mode, switches Sw3 and Sw4, driven by PIRST_B, may be open so that the pre-amplifier stage may be disconnected from the multipath amplifier. In the meantime, Sw1 and Sw2 may be closed to perform an auto-zero function, so that a null voltage is stored at auto-zero capacitors C1 and C2.

During the integration mode, the switches Sw1 and the Sw2 may be open, and the null voltage at the capacitors C1 and C2 may be maintained to null out any offset current at the output terminal (OUTP/OUTN). The switches Sw3 and the Sw4 may be closed to connect to representative ones of the differential outputs OUTN and OUTP, which are connected to respective input terminals of the amplifier A2 (INP1/INN1).

FIG. 5 illustrates an embodiment of an exemplary multipath amplifier with multi-differential inputs according to an embodiment of the present invention. The exemplary multipath amplifier may receive differential input voltages on INN1 and INP1. In FIG. 5, the multipath amplifier may have both an N-channel input pair with Mn11/Mn12 and a P-channel input pair with Mp11/Mp12, to accommodate either higher or lower input common mode voltage at the INP2/INN2 terminal. The multipath amplifier may employ a folded cascode stage to enhance the DC gain. A folded cascode stage may contain a PMOS current mirror (Mp15, Mp16, M17, and Mp18), and a NMOS current sources (Mn15, Mn16, Mn17, and Mn18). The multipath amplifier may have another differential input (INP1/INN1) at the source of the Mn17 and the Mn18, to receive the current signal from the A1.

In operation, the embodiment of FIG. 5 may also operate in two modes: a reset mode and an integration mode. During the reset mode, the INP1/INN1 may be isolated from amplifier A1 and the inputs INP2/INN2 may be the only active inputs. By the feedback operation, the voltage at the INN2 and the OUT output voltage are forced to the voltage $V_{REF-HI}$. During the integration mode, the INP1/INN1 is connected to the output of the pre-amplifier stage of FIG. 4 to receive its output current.

The open loop gain (AOL) equation of the multi-path amplifier is shown below in Equation 1 (Eq. 1), while amplifier A1 may be associated with the path through INP1/INN1 and the amplifier A2 may be associated with the path through INP2/INN2.

$$A_{OL}(s) = \frac{C_{LS}}{C_{LS} + C_{in1}} A_1(s) + A_2(s) = \left( \frac{C_{LS}}{C_{LS} + C_{in1}} (g_{mp1} \cdot R_{n1}) \cdot g_{mp5} + g_{m11} \right) \cdot Z_{out}(s) \quad \text{(Eq. 1)}$$

$$(A_1(s) = (g_{mp1} \cdot R_{n1}) \cdot Z_{out}(s))$$

$$(A_2(s) = g_{m11} \cdot Z_{out}(s))$$

FIG. 5 is one of a plurality of exemplary configurations of the multipath amplifier stage, which, for example, may be used with the pre-amplifier stage shown in the FIG. 4.

Figure 6:
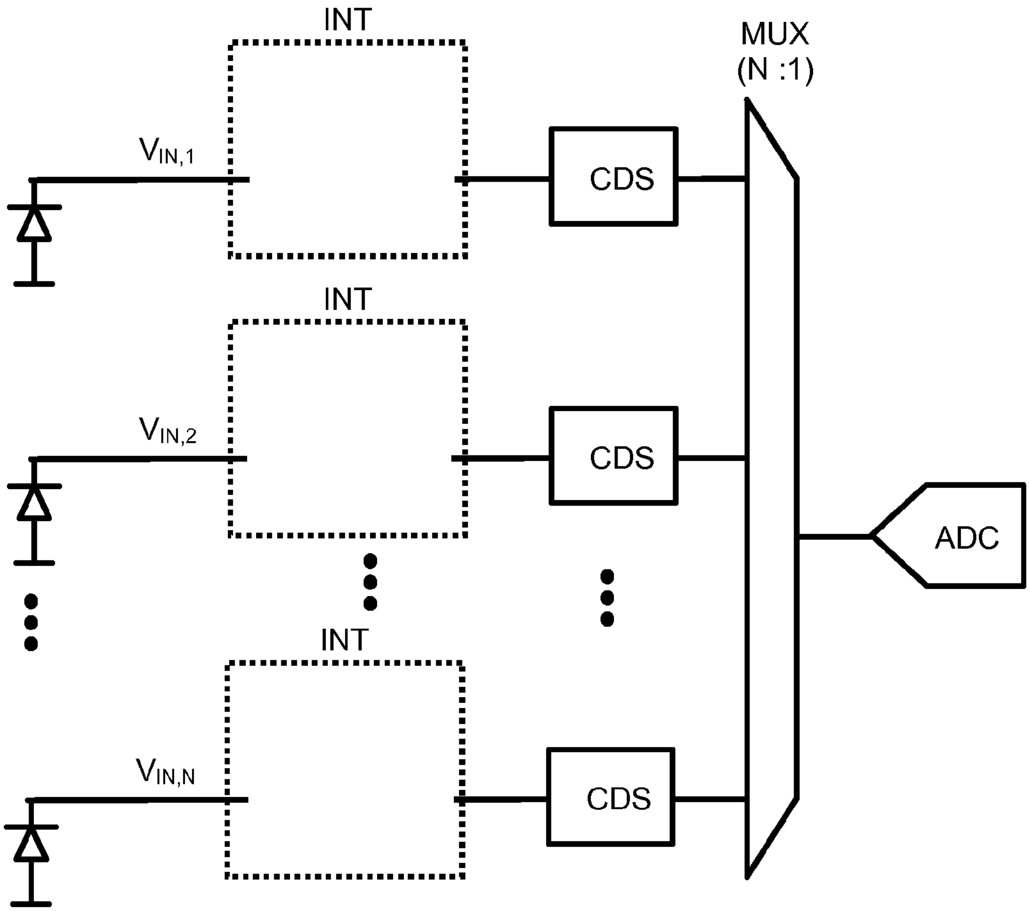
FIG. 6 illustrates an exemplary application according to an embodiment of the present invention.

The disclosed integration circuit may be employed in a plurality of applications. One such application is illustrated in FIG. 6. FIG. 6 illustrates an exemplary implementation according to an embodiment of the present invention.

The disclosed integration circuit may be used, for example, as a digital X-ray analog front end (AFE). The AFE can act as a multi-channel data acquisition system, where one channel contains an embodiment of the disclosed integrator (INT) and a correlated double sampling stage (CDS). The INT may integrate the charge signal from the photodiode sensor. Any reset noise of the INT may be removed by the CDS stage. The acquired signals may be multiplexed and digitized by the MUX and the ADC.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure.

What is claimed is:

1. An integrator circuit, comprising:

a pre-amplifier stage having a first input for receiving a reduced voltage, a second input for a first reference voltage, and an input for a first power supply voltage;

a multi-path amplifier module having a first amplification path connected among a second reference voltage, an input of the integrator circuit, and an output of the integrator circuit, a second amplification path connected between the pre-amplifier stage and the output of the integrator circuit, and an input for a second power supply voltage, wherein the second power supply voltage is greater than the first supply power voltage, and an output connected to the output of the integrator circuit;

a level-shifting capacitor connected to the input of the integrator circuit, and to the first input of the pre-amplifier stage, wherein the level-shifting capacitor provides the reduced voltage to the pre-amplifier stage; and a feedback capacitor connected between the input and the output of the integrator circuit.

2. The integrator circuit of claim 1, comprising:

a plurality of switches, wherein when a first of the plurality of switches, connected between the first and second inputs ofte the pre-amplifier stage, is closed, a circuit path across the first and second inputs of the pre-amplifier circuit is created, and when a second of the plurality of switches, connected between the input and output of the integrator circuit, is closed, a circuit path across the input and output of the integrator circuit is created.

3. The integrator circuit of claim 1, wherein the first supply voltage is provided either from within the pre-amplifier stage or by an external voltage source.

4. The integrator circuit of claim 1, the preamplifier stage further comprising:

a pair of differential outputs that output a difference between the reduced voltage and the first reference voltage.

5. The integrator circuit of claim 1, wherein the level-shifting capacitor reduces the voltage level of the input of the integrator circuit to a voltage level that is less than or equal to the first supply voltage.

6. The integrator circuit of claim 2, wherein the multi-path amplifier module comprises:

a first transconductance amplifier stage in the first amplification path, having a first input for receiving the input of the integrator circuit and a second input for receiving the second reference voltage, and a second transconductance amplifier stage in the second amplification path, having a pair of differential inputs for receiving the pair of differential outputs from the pre-amplifier stage.

7. The integrator circuit of claim 6, wherein when the switches are in a closed position, the voltage at the first input of the pre-amplifier stage is set to the first reference voltage connected to the second input of the pre-amplifier stage, and the voltage at the input and the output of the integrator circuit is set to the second reference voltage connected to the second input of the first transconductance amplifier.

8. A method for integrating an input current signal in a reduced power integrator circuit, comprising:

providing a first power supply voltage to a first amplifier stage;

providing a second power supply voltage to a second amplifier stage, wherein the second power supply voltage is greater than the first power supply voltage;

receiving the input current signal at the input of the integrator circuit, applying the input current signal to a level-shifting capacitor and at an input to the second amplifier stage;

applying a reduced voltage from the level-shifting capacitor to the first amplifier stage, wherein the reduced voltage is less than or equal to the first power supply voltage;

outputting a differential amplified voltage from the first amplifier stage based on the reduced input voltage compared to a low reference voltage to a third amplifier stage;

in the third amplifier stage, amplifying the difference of the differential amplified voltage and outputting a first amplified signal;

outputting a second amplified signal from the second amplifier stage based on the input voltage of the integrator circuit compared to a high reference voltage;

combining the first amplified signal and the second amplified signal at the output of the integrator circuit; and integrating the input current signal over a feedback capacitor connected in parallel to the first, second and third amplifier stages and connecting the input of the integrator circuit to the output of the integrator circuit.

9. A circuit for integrating an input current signal, comprising:

an input for an input current signal;

a level shifting capacitor connected to the input that provides a reduced voltage level to an input of a pre-amplifier stage, wherein the pre-amplifier stage is supplied with a first power supply voltage;

a multipath amplifier stage having a first transconductance amplifier connected to the input and to a reference voltage and a second transconductance amplifier that receives a pair of differential inputs from the pre-amplifier stage, wherein the output of the first transconductance amplifier and the output of the second transconductance amplifier are connected together at an output of the circuit, wherein the first transconductance amplifier and the second transconductance amplifier is supplied with a second power supply voltage that is greater than the first poser supply voltage; and a feedback capacitor connected to the input and to the output of the circuit.

* * * * *

UNITED STATES PATENT AND TRADEMARK OFFICE

CERTIFICATE OF CORRECTION

PATENT NO. : 8,125,262 B2
APPLICATION NO. : 12/726455
DATED : February 28, 2012
INVENTOR(S) : Yoshinori Kusuda It is certified that error appears in the above-identified patent and that said Letters Patent is hereby corrected as shown below:

In the Claims:

In column 7, line 45, claim 2, change “ofte” to -- of --

Signed and Sealed this
Sixth Day of August, 2013

Teresa Stanek Rea
*Acting Director of the United States Patent and Trademark Office*